United States Patent [19]

Niitsuma et al.

[11] Patent Number: 4,745,378
[45] Date of Patent: May 17, 1988

[54] SURFACE ACOUSTIC WAVE DEVICE

[75] Inventors: Teruo Niitsuma; Takeshi Okamoto; Shoichi Minagawa, all of Tokyo, Japan

[73] Assignee: Clarion Co., Ltd., Tokyo, Japan

[21] Appl. No.: 99,688

[22] Filed: Sep. 18, 1987

Related U.S. Application Data

[63] Continuation of Ser. No. 774,423, Sep. 10, 1985.

[30] Foreign Application Priority Data

Sep. 21, 1984 [JP] Japan ................... 59-198985
Sep. 21, 1984 [JP] Japan ................... 59-198986
Sep. 21, 1984 [JP] Japan ................... 59-198987

[51] Int. Cl.[4] .............................................. H03H 9/00
[52] U.S. Cl. ............................... 333/196; 310/313 B; 333/154

[58] Field of Search ................... 367/140; 310/313 B, 310/313 D; 333/154, 196

[56] References Cited

U.S. PATENT DOCUMENTS 4,328,473 5/1982 Montress et al. ................... 333/154
4,473,767 9/1984 Minagawa et al. .............. 310/313 B Primary Examiner—Theodore M. Blum
Attorney, Agent, or Firm—Flynn, Thiel, Boutell & Tanis

[57] ABSTRACT

The surface acoustic wave device includes a plurality of output gate electrodes provided between two signal input transducers on a piezoelectric layer on a semiconductor substrate, so that each output gate electrode receives a bias voltage unique to it and supplies an output signal based on the unique bias voltage.

9 Claims, 5 Drawing Sheets

SURFACE ACOUSTIC WAVE DEVICE

This application is a continuation of U.S. Ser. No. 774 423, filed Sept. 10, 1985.

FIELD OF THE INVENTION

This invention relates to a monolithic surface acoustic wave device comprising a semiconductor substrate and a piezoelectric film provided thereon, and more particularly to a surface acoustic wave convolver or correlator based on said structure.

BACKGROUND OF THE INVENTION

Surface acoustic wave convolvers or correlators are known as a small-scaled device which utilizes a surface acoustic wave for signal processing. They are generally classified into one type having monolithic structures and the other type having non-monolithic structures. Monolithic structures are more advantageous in manufacturing and effectiveness of these devices. In a monolithic surface accoustic wave convolver or correlator comprising a semiconductor substrate and a piezoelectric film, its signal processing function is caused by a non-linear interaction between a surface acoustic wave and a space charge region along a surface of the semiconductor. A structure which has been conventionally proposed to use the phenomenon is shown in FIGS. 9 and 10 wherein an insulating film 3 is provided on one surface of a semiconductor substrate 1, and a piezoelectric film 2 is provided on the insulating film 3. On the piezoelectric film 2 and near both ends thereof are provided input transducers 4a-4b for entering a signal thereinto and a gate electrode 5 for outputting a processed signal. FIG. 9 also shows a ground or bottom electrode 6 provided along the other surface of the semiconductor substrate 1. FIG. 10 further shows a variable d.c. bias source 7, a d.c. blocking capacitor 8, matching circuits 9a-9b-9c, signal sources 10a-10b, and an external load resistance 11 from which an output signal is extracted.

With this arrangement, non-linear interaction takes place just below the gate electrode 5 (this region is referred to as "interaction region" in this text), and an output is picked up from a point between the gate electrode 5 and bottom electrode 6. The magnitude of the interaction depends on the capacity-to-voltage (C-V) characteristic in the interaction region along the surface of the semiconductor substrate 1, and greatly varies with d.c. bias voltage applied between the gate electrode 5 and the bottom electrode 6 connected to ground. Therefore, it has been most usual in the prior art to uniformly apply to the entire interaction region a single bias voltage maximixing the total output from the gate electrode.

However, since the C-V characteristic of the interaction region is not uniform but varies with location, a uniform bias cannot be the best voltage value for some locations with different C-V characteristics, and cannot cause the optimum function of the device. This is particularly serious in a device having an elongated interaction region for an improved signal processing capacity.

Montress U.S. Pat. No. 4,328,473 and Minagawa U.S. Pat. No. 4,473,767 disclose technologies corresponding to the aforegoing prior art. In particular, Montress U.S. Pat. No. 4,328,473 discloses multiple bias applying gate electrodes and a single output gate electrode. However, since the output gate electrode is unitary or integral on the substrate, the bias applying gate electrodes and the output gate electrode are separate members. Therefore, although multiple bias sources are shown, they do not contribute to solution of the aforementioned problem.

Minagawa U.S. Pat. No. 4,473,767 teaches the use of a SAW device having a bias gate electrode. However, the bias gate electrode is used for adding alternating components of both transducers to a d.c. bias component. Therefore, although a bias is applied, no non-linear interaction occurs just under the bias gate electrode (this occurs in a separate semiconductor), and the output electrode of the device is a member separate from the gate electrode. This means that the device is far from a solution of the aforementioned problem.

OBJECT OF THE INVENTION

It is therefore an object of the invention to provide a monolithic surface acoustic wave device which can apply different, unique and optimum d.c. bias voltages to individual locations with different C-V characteristics in the interaction region so as to optimize the resulting total effectiveness of the device.

SUMMARY OF THE INVENTION

In accordance with the invention, there is provided a surface acoustic wave device comprising:
 a semicondutor substrate;
 a piezoelectric film provided on one surface of said substrate;
 two signal input transducers provided at both ends of of said piezoelectric film to enter a signal;
 a plurality of output gate electrodes provided on said piezoelectric film and between said input transducers;
 bias voltage applying means for applying unique bias voltages to respective said output gate electrodes; and
 output signal extracting means for extracting output signals from said respective output gate electrodes.

The invention will be understood better from the description given below, referring to some preferred embodiments illustrated in the accompanying drawings.

DETAILED DESCRIPTION

Figure 1:
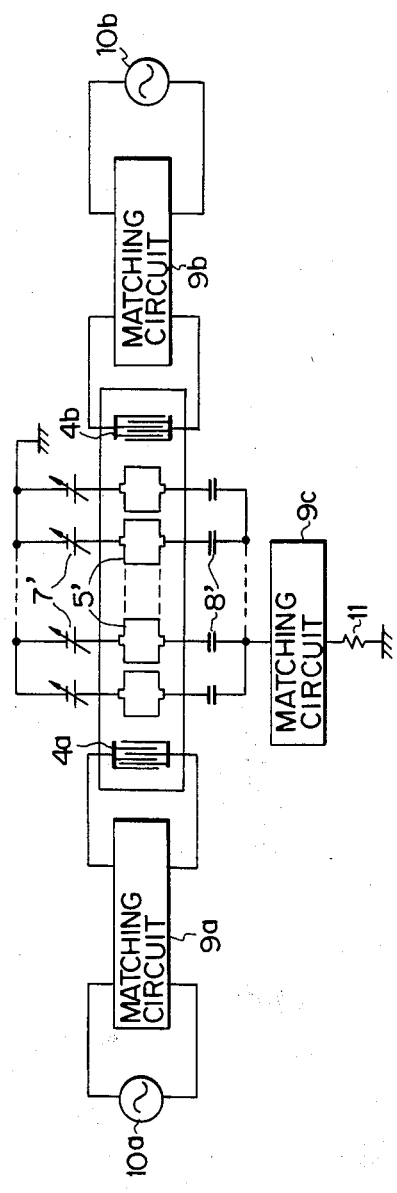
FIG. 1 is a diagrammatic plan view of a surface acoustic wave device embodying the invention and some related circuit elements.
Figure 10:
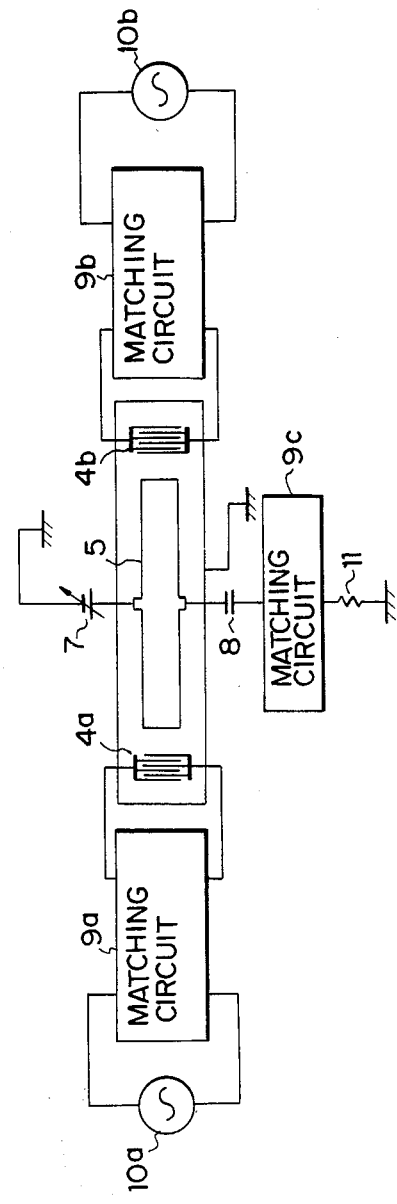
FIG. 10 is a diagrammatic plan view of the device of FIG. 9 and some related circuit elements.

FIG. 1 is a diagrammatic plan view of a surface acoustic wave device embodying the invention. The same members or elements as in the prior art of FIG. 10 are identified by the same reference numerals as in FIG. 10. The gate electrode 5, d.c. bias source 7 and d.c. voltage blocking capacitor 8 in the prior art (FIG. 10) are divided or branched into some segments or lines shown at 5'—5', 7'—7' and 8'—8', respectively. These gate electrodes 5'—5' are aligned in a direction connecting the input transducers 4a and 4b provided near both ends of the device. Each gate electrode 5' is connected to one d.c. bias source 7' which is independently controlled or adjusted to give the gate electrode 5' the optimum bias voltage most suitable for the C-V characteristic of the location of the interaction region just under the associated gate electrode 5'. Individual locations under the respective gate electrodes 5'—5' process a signal and produce their own results which are passed through the capacitors 8' and gathered together into an output.

The monolithic surface according to the invention is based on a multi-layer structure including the semiconductor substrate 1 and piezoelectric film 3. For improved operation and temperature characteristic or for facilitating incorporation into an integrated circuit, preferred structures are some combinations of aluminum oxide $Al_2O_3$ (sapphire single crystal), silicon single crystal Si, silicon dioxide $SiO_2$ and a piezoelectric film of zinc oxide ZnO or aluminum nitride AlN, i.e. $ZnO/SiO_2/Si$, $ZnO/SiO_2/Si/Al_2O_3$, AlN/Si or $AlN/Si/Al_2O_3$.

Figure 2:
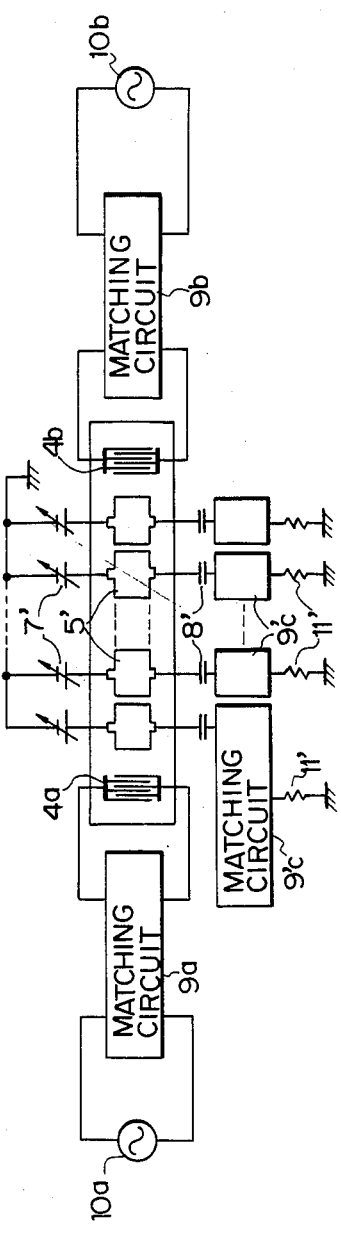
FIG. 2 is a diagrammatic plan view illustrating a second embodiment of the invention.

FIG. 2 is a plan view of a surface acoustic wave device which is a second embodiment of the invention wherein the matching circuit 9c and external load resistance 11 in the embodiment of FIG. 1 are divided or branched into some segments or lines shown at 9'—9'c and 11'—11', corresponding to the individual gate electrodes 5'—5', d.c. bias sources 7'—7' and d.c. blocking capacitors 8'—8'. Therefore, a result of signal processing by one group associated with one gate electrode 5' can be extracted or detected as an output independently and separately from other results from other groups.

Figure 3:
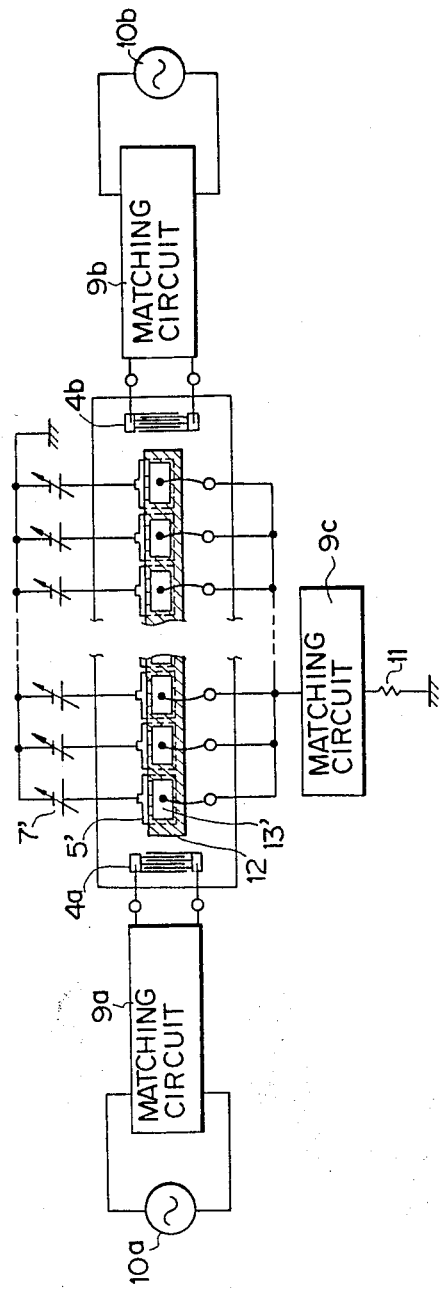
FIG. 3 is a diagrammatic plan view showing a third embodiment of the invention.
Figure 4:
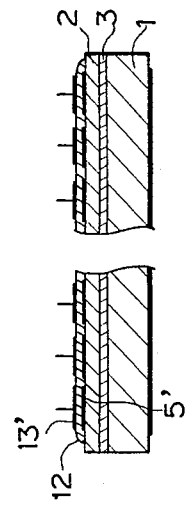
FIG. 4 is a cross-sectional view of the device of FIG. 3.

FIG. 3 is a plan view of a third embodiment of the invention, and FIG. 4 is a cross-sectional view of the device of FIG. 3. In both Figures, the same reference numerals as those in the first embodiment of FIG. 1 denote identical elements or members.

The third embodiment employs a specific form of d.c. voltage blocking capacitors. More specifically, a dielectric film 12 of a predetermined thickness is provided on the gate electrodes 5'—5', and a plurality of signal extracting electrodes 13'—13' are provided on the dielectric film 12 at opposite locations with respect to the gate electrodes 5'—5'. The gate electrode 5' and signal extracting electrode 13' are insulated so as block the flow of direct current and therefore form a d.c. voltage blocking capacitor.

Obviously, application of different bias voltages to locations of the interaction region under the gate electrodes 5'—5', separate signal processings in said respective locations and extraction of a resultant output in the third embodiment are effected in the substantially same fashion as in the first embodiment.

Figure 5:
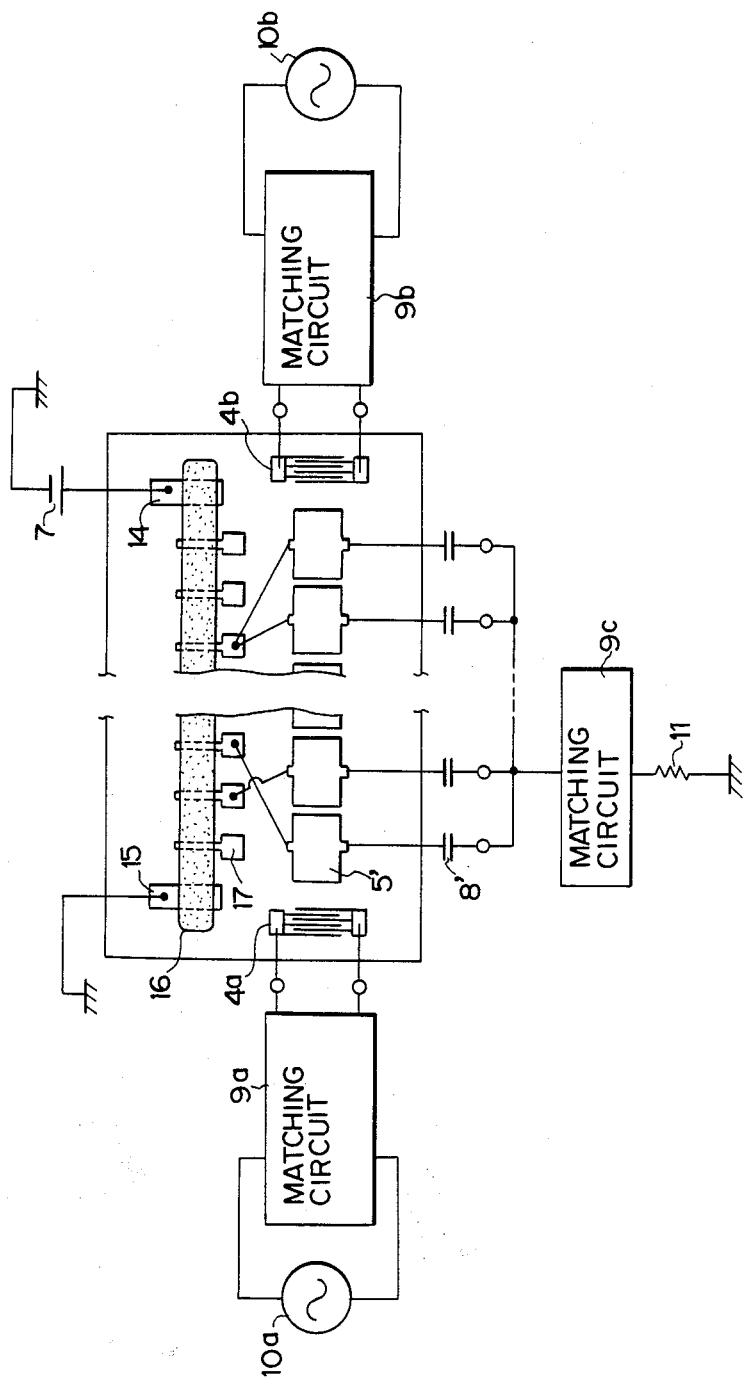
FIG. 5 is a diagrammatic plan view of a forth embodiment of the invention.
Figure 9:
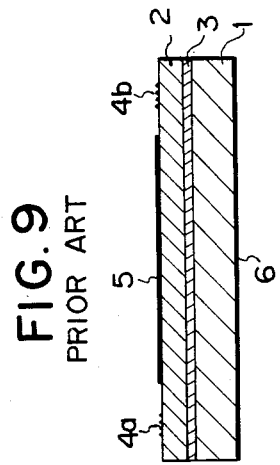
FIG. 9 is a cross-sectional view of a prior art surface acoustic wave device.

FIG. 5 is a plan view showing a fourth embodiment of the invention wherein the same reference numerals used in FIGS. 9, 10 denote identical elements or parts.

On the same plane as the gate electrodes 5'—5' are provided a constant voltage terminal 14 and an earth or ground terminal 15 which are connected by a resistance layer 16 having an appropriate sheet resistivity. The resistance layer 16 is preferably a nichrom or cermet (Cr-SiO) vacuum vapour deposition layer, tentalum nitride ($Ta_2N$) sputtering layer or the like which are readily manufactured and have an appropriate sheet resistivity. Across the resistance layer 16 are provided bias voltage take-up taps 17 at an appropriate interval. The bias voltage to each gate electrode 5' is properly selected by connecting the gate electrode 5' to one of the taps 17 which gives it a desired voltage upon application of a constant voltage to the constant voltage terminal 12, and may be further adjusted by trimming the resistance layer 16 by a laser or electrode beam. Thus each gate electrode 5' receives a bias voltage which is most preferable to the C-V characteristic of the location in the interaction region just under it. Each result of each signal processing in each location is outputted through the associated d.c. voltage blocking capacitor 8'.

Figure 6:
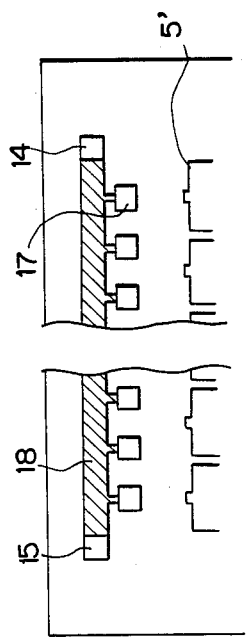
FIG. 6 is a fragmental diagrammatic plan view illustrating an alternative form of the resistance layer in the embodiment of FIG. 5.

FIG. 6 shows a resistance layer 18 made of an antimony, bismuth, tantalum or other metal film which replaces the resitance layer 16 of FIG. 2.

Figure 7:
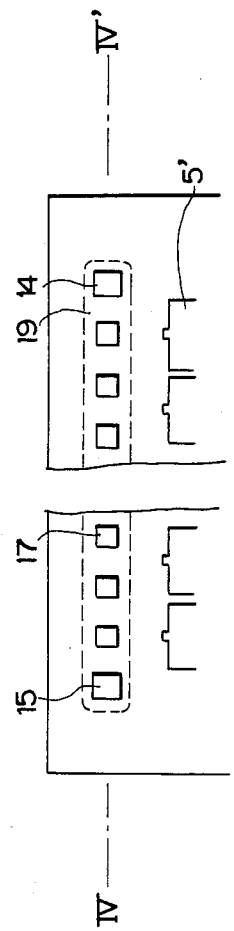
FIG. 7 is a fragmental diagrammatic plan view illustrating a further embodiment of the invention.
Figure 8:
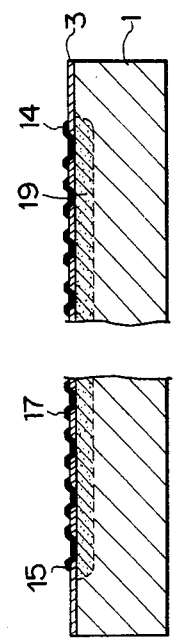
FIG. 8 is a cross-sectional view of the device of FIG. 7.

FIG. 7 is a plan view of a further embodiment using a resistance layer 19 formed in the semiconductor substrate 1, and FIG. 8 is a cross-sectional view along IV-IV line of FIG. 7. Before the insulating film 3 is provided on the semiconductor substrate 1, impurities are entered in a region of the substrate 1 encircled by a broken line in FIG. 7 up to a predetermined impurity concentration, and form a high impurity concentration region 19 which serves as the resistance layer. After the insulating film 3 is provided on the substrate 1 and the region 18, the insulating film 3 is selectively removed by etching to form windows which expose selective portions of the high impurity concentration region 19, and electrodes are provided in the windows. One of the end electrodes serves as the constant voltage terminal 14, and the other of the end electrodes is used as the earth terminal 15. The other electrodes between both terminal electrodes 14 and 15 are used as bias voltage take-up taps 17.

As described above, since the monolithic surface acoustic wave convolver or correlator according to the present invention employs divisional output gate electrodes, the bias voltage to the gate electrodes can be adjusted location by location so as to give each gate electrode 5' a unique value of the bias voltage which is most suitable for the C-V characteristic of the interaction region just under the gate electrode 5'. Therefore, the resulting effectiveness of the entire device is significantly improved.

The embodiments of the invention in which an exclusive property or privilege is claimed or defined as follows:

1. A surface acoustic wave device comprising:
    a semiconductor substrate;
    a piezoelectric film provided on one surface of said substrate;
    two signal input transducers which are provided at spaced locations on said piezoelectric film and can each enter a signal thereinto;
    a plurality of electrically separate output gate electrodes provided on said piezoelectric film between said input transducers, said substrate having a plurality of interaction regions which are each associated with a respective said gate electrode;

bias voltage applying means connected directly to each said output gate electrode for applying to each of said output gate electrodes a respective bias voltage independently selected to optimize a capacity-to-voltage characteristic in the associated interaction region of said substrate, said bias voltage applying means including a plurality of independently variable bias voltage sources which are each connected to a respective said output gate electrode; and output signal extracting means for extracting a respective output signal from each of said output gate electrodes, said output signal extracting means including a plurality of DC blocking capacitors which each have one end connected to a respective one of said output gate electrodes, each said output signal being extracted through a respective said blocking capacitor.

2. A surface acoustic wave device of claim 1 wherein said output signal extracting means includes a dielectric film provided on said output gate electrodes and said blocking capacitors include a plurality of signal extracting electrodes provided on said dielectric film at locations aligned with respective said gate electrodes.

3. A surface acoustic wave device of claim 2, including a matching circuit having an input, each of said signal extracting electrodes being connected to said input of said matching circuit.

4. A surface acoustic wave device of claim 1, wherein said output signal extracting means is directly electrically connected to each said output gate electrode.

5. A surface acoustic wave device of claim 4, wherein said output signal extracting means includes a matching circuit having an input, each said capacitor having a further end which is remote from said one end and is connected to said input of said matching circuit.

6. A surface acoustic wave device of claim 4, including a plurality of matching circuits which each have an input, each said capacitor having a further end which is remote from said one end and which is connected to the input of a respective said matching circuit.

7. A surface acoustic wave device, comprising:
a semiconductor substrate having first and second surfaces on opposite sides thereof;
an insulation film provided on said first surface of said substrate;
a piezoelectric film provided on said insulation film;
two signal input transducers provided at spaced positions on said piezoelectric film;
a ground electrode provided on said second surface of said semiconductor substrate and connected to ground;
a plurality of signal output gate electrodes provided on said piezoelectric film between said two signal input transducers;
optimum bias applying means connected to said output gate electrodes for supplying each said output gate electrode with an optimum d.c. bias voltage which optimizes the capacitance-voltage characteristic of a respective region under such output gate electrode where an interaction occurs between surface acoustic waves and a depletion layer provided along said first surface of said substrate; and
output signal extracting means for extracting a respective output signal from each said output gate electrode, said output signal extracting means including a plurality of d.c. blocking capacitors which each have a terminal connected to a respective said output gate electrode so that each said output signal is extracted through a respective said d.c. blocking capacitor.

8. A surface acoustic wave device of claim 7, wherein said optimum bias applying means includes a plurality of variable d.c. bias sources which are each connected to a respective said output gate electrode and which are adjustable independently.

9. A surface acoustic wave device of claim 7, wherein said optimum bias applying means includes a resistance layer and d.c. bias source means connected to said resistance layer, said resistance layer having a plurality of bias voltage extracting taps which are each connected to a respective said gate electrode.

* * * * *